(12) United States Patent
Choi

(10) Patent No.: US 6,226,214 B1
(45) Date of Patent: May 1, 2001

(54) READ ONLY MEMORY

(75) Inventor: Byeng-Sun Choi, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/082,060

(22) Filed: May 21, 1998

(30) Foreign Application Priority Data

May 24, 1997 (KR) .................................................. 97-20507

(51) Int. Cl.[7] .............................. G11C 8/00; G11C 17/00
(52) U.S. Cl. ...................................... 365/230.03; 365/104
(58) Field of Search .............................. 365/230.03, 103, 365/104

(56) References Cited

U.S. PATENT DOCUMENTS 5,268,861 * 12/1993 Hotta ..................................... 365/104
5,349,563 * 9/1994 Iwase ............................... 365/230.03
5,506,813 * 4/1996 Mochizuki et al. .................. 365/104

\* cited by examiner

*Primary Examiner*—David Nelms
*Assistant Examiner*—Trong Phan
(74) *Attorney, Agent, or Firm*—Jones, Volentine, Steinberg & Whitt, L.L.P.

(57) ABSTRACT

The disclosed is a read only memory having a plurality of memory blocks each associated with main bit lines and sub-bit lines, and a plurality of memory cells for storing information, and sense amplifiers for reading the information stored in the memory cells through the main bit lines. The memory also has a block selection part disposed between the blocks and having a plurality of block selection transistors connecting the main bit lines to the sub-bit lines. The sub-bit lines elongate to at least an adjacent block and alternatively connected to the main bit lines through the block selection part.

10 Claims, 6 Drawing Sheets

READ ONLY MEMORY

FIELD OF THE INVENTION

The invention relates to read only memories (ROMs), and more specifically to NOR-type ROMs.

BACKGROUND OF THE INVENTION

There has been widely used, as a ROM (or mask ROM), the NOR-type ROM in which sources and drains of memory cells are formed with N-type conductive diffusion regions and word lines are arranged perpendicular to the diffusion regions. A circuit pattern with a matrix of memory cells in the N-type diffusion layers has been proposed in U.S. Pat. No. 5,268,861 by Y. Hotta et al and U.S. Pat. No. 5,349,563 by T. Iwase.

FIG. 1 shows Hotta's circuit configuration of a memory cell array in a ROM, and FIG. 2 is a plan view of the same memory cell array. In FIG. 1, the arrangement of bit lines is constructed of main bit lines MBL1~MBL4 and sub-bit lines SB1~SB8. Each of the odd-numbered main bit lines are connected to two of the odd-numbered sub-bit lines through two of the odd-numbered bank selection transistors BSO1~BSO4 in which gates of BSO1 and BSO3 are coupled to bank selection line BO1 and gates of BSO2 and BSO4 to BO2. Each of the even-numbered main bit lines are connected to two of the even-numbered sub-bit lines through two of even-numbered bank selection transistors BSE1~BSE4 in which gates of BSE1 and BSE3 are coupled to bank selection line BE1 and gates of BSE2 and BSE4 to BE2. And the odd-numbered main bit lines MBL1 and MBL3 are each coupled to sense amplifiers SA1 and SA2, and the even-numbered main bit lines MBL2 and MBL2 are connected to a ground potential each through transistors Q2 and Q3 gates of which are connected to control signal VS. Each of word lines WL1~WLn intersecting the bit lines is coupled to control gates of memory cells that are arranged in a row direction, while each of the sub-bit lines is coupled to adjacent memory cells.

In a read operation, assuming that M41 is on-cell and selected therein, BO1 and BE2 are set into a high potential while BO2 and BE1 are held in a low potential. WL1 goes to high level and VS is too high to switch Q2 on. Therefore, the current path for sensing is formed from MBL to the ground, through BSO3, SB5, M41, SB4, BSE2, MBL2 and Q2.

Referring FIG. 2, it is well known that the current path for sensing includes two regions 3 and 4 which are vertically formed of the diffusion layer, a gate oxide layer and the word line, as well as passing through the aforementioned positions. Such constructions of stray capacitances involved in the sensing current path cause the level of the sensing voltage to be reduced thereby, resulting in degrading an efficiency of the sensing operation. On the other hand, the sub-bit lines are formed by an N-conductive type diffusion layer, which is used for an active region of the bank selection transistor and determines channel width W of the bank selection transistor as shown in FIG. 2. The limit against the channel width of the bank selection transistor causes an increase of on-resistance (a resistance when the sensing current flows through an on cell) that reduces the amount of the sensing current for the on-cell.

Furthermore, the main bit line is connected to the active region of the bank selection transistor, at region 1 of the diffusion layer, through contact hole 2. With this construction, a junction capacitance between the main bit line and the region 2 and a gate capacitance of the bank selection transistor at the bit line badly influences the speed of data accessing.

SUMMARY OF THE INVENTION

Accordingly, it is a primary object of the invention to provide a ROM capable of enhancing the speed of data sensing.

It is another object of the invention to provide a ROM capable of reducing resistance and capacitance during a read operation.

Typically, in order to accomplish those objects, a memory of this invention, having a plurality of memory blocks each associated with main bit lines and sub-bit lines, and a plurality of memory cells for storing information, and sense amplifiers for reading the information stored in the memory cells through the main bit lines, includes a block selection part disposed between the blocks and having a plurality of block selection transistors connecting the main bit lines to the sub-bit lines. The sub-bit lines elongate to at least an adjacent block and alternatively connected to the main bit lines through the block selection part and each of the block selection parts is commonly used by the adjacent blocks.

The invention specifies various aspects of the embodiment, providing a read only memory having a plurality of main bit lines and sub-bit lines including: a substrate in which a plurality of blocks are defined, each of the blocks having a plurality of memory cells storing information; a plurality of diffusion layers formed in the substrate to be used for the sub-bit lines and arranged in a row direction, the diffusion layers belong to one of the blocks being elongated to adjacent blocks; a plurality of block selection lines of conductive layers arranged in a column direction and formed over the diffusion layers in an intersectional pattern, the selection lines connected to block selection transistors formed in a selection part shared by the adjacent blocks; and a plurality of conductive layers formed over the block selection lines to be used for the main bit lines and selectively connected to the sub-bit lines through the block selection transistors, or a read only memory a read only memory having a plurality of main bit lines and sub-bit lines including: a substrate in which a plurality of blocks are defined, each of the blocks having a plurality of memory cells storing information; a plurality of diffusion layers formed in the substrate to be used for the sub-bit lines and arranged in a row direction, the diffusion layers belong to one of the blocks being elongated to an adjacent block; a plurality of first block selection lines of conductive layers arranged in a column direction and formed over the diffusion layers in an intersectional pattern, the first block selection lines connected to first block selection transistors formed in a first selection part, the first block selection transistors being formed in a diffused region and defined by field oxide regions; a plurality of second block selection lines of conductive layers arranged in the column direction and formed over the diffusion layers in an intersectional pattern, the second block selection lines connected to second block selection transistors formed in a second selection part shared by the adjacent block; and a plurality of conductive layers formed over the block selection lines to be used for the main bit lines and selectively connected to the sub-bit lines through the block selection transistors. one of the diffusion layers is electrically disconnected from another diffusion layer through a programmed region. The first block selection transistor is associated with a depletion transistor in the diffused region when a read operation is being conductive for reading information from a selected memory cell of one of the blocks.

BRIEF DESCRIPTION OF THE DRAWINGS

For a better understanding of the invention, and to show how embodiments of the same may be carried into effect, reference will now be made, by way of example, to the accompanying diagrammatic drawings, in which.

In the figures, like reference numerals denote like or corresponding parts.

DETAILED DESCRIPTION OF THE PREFERRED EMBODIMENTS

Hereinbelow, applicable embodiments of the invention will be as follows, with the appended drawings.

Figure 3:
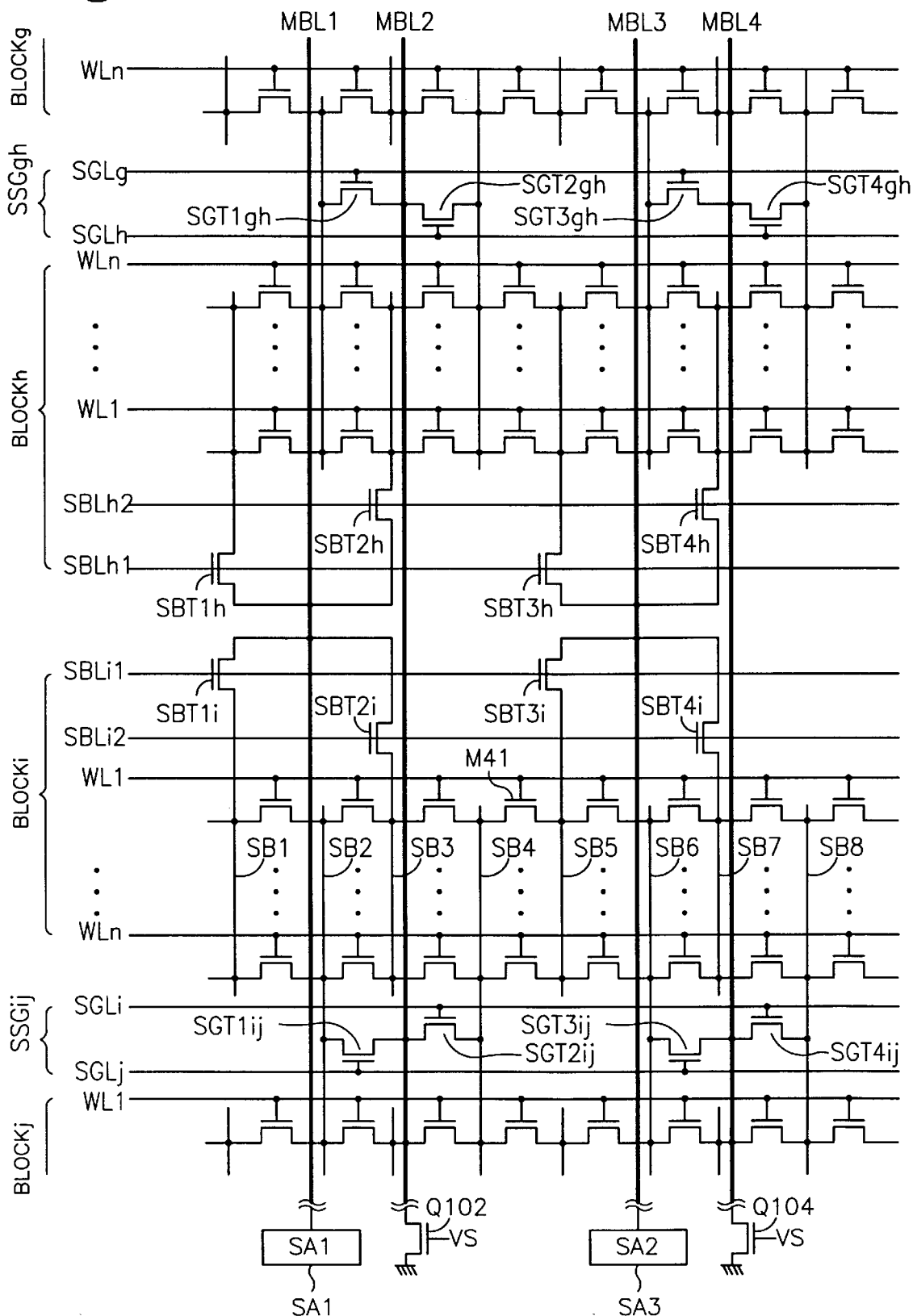
FIG. 3 is a circuit diagram of a proposed cell array in a ROM according to a preferred embodiment of the invention.
Figure 4:
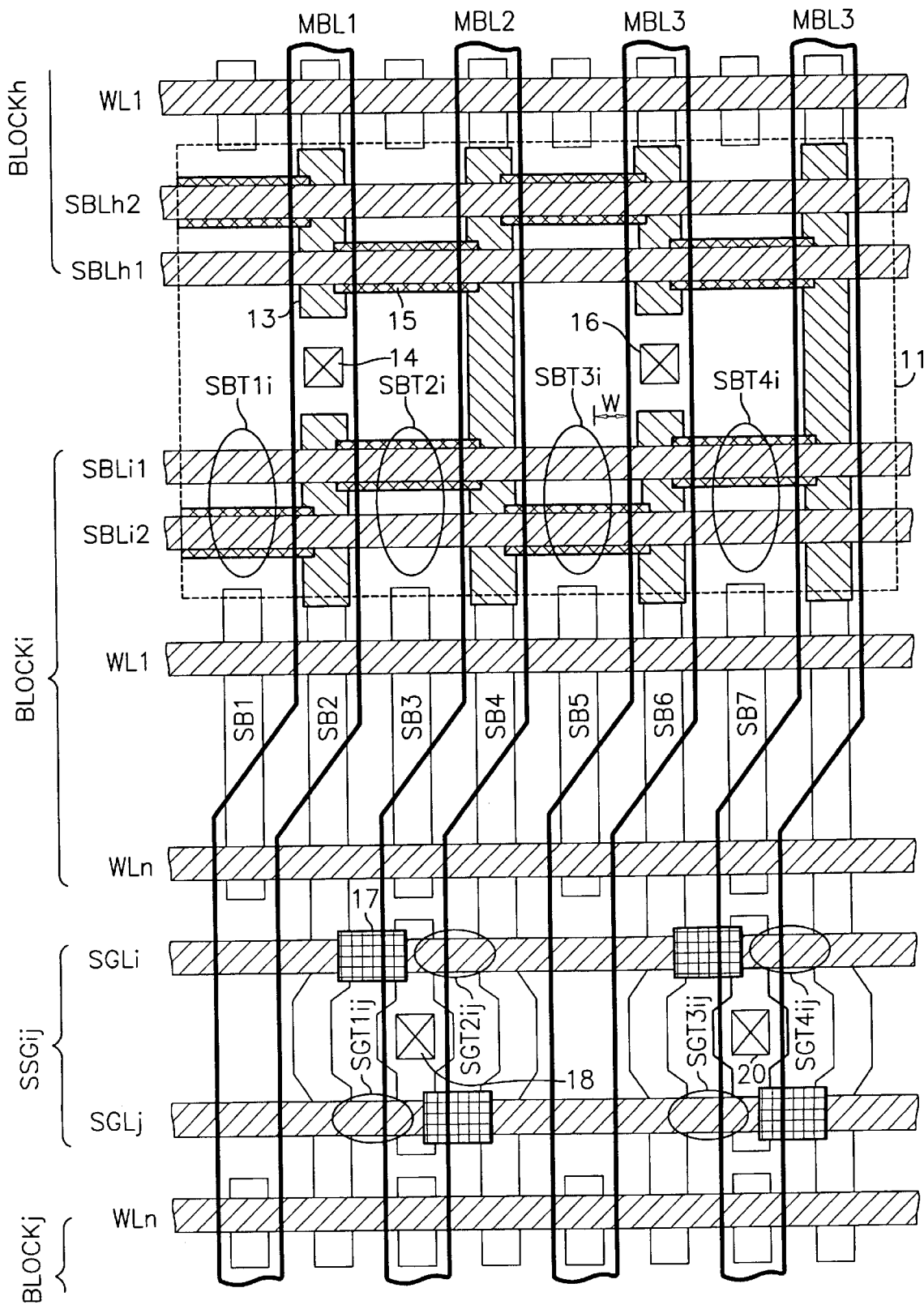
FIG. 4 is a plan view disclosing a specification of a layout corresponding to the circuit of FIG. 3.

FIGS. 3 and 4 illustrate a first embodiment of the invention. Referring to FIG. 3, subsequently adjacent blocks BLOCKg, BLOCKh, BLOCKi and BLOCKj are arranged therewith. Over the blocks, main bit lines MBL1~MBL4 are arranged in parallel with sub-bit lines SB1~SB8. The two hierarchical bit lines of the main bit lines and sub-bit lines are connected therebetween through block selection transistors SBT* (* represents its subsidiary references) and ground selection transistors SGT*. In the blocks, each of the odd-numbered main bit lines MBL1 and MBL3 (referred to as virtual bit lines) are connected to adjacent two of the odd-numbered sub-bit lines, SB1 and SB3, through two of the odd-numbered block selection transistors SBT*, and each of the even-numbered main bit lines MBL2 and MBL4 (referred to as virtual ground lines) are connected to an adjacent two of the even-numbered sub-bit lines through two of the even-numbered ground selection transistors SGT*. The odd-numbered main bit lines MBL1 and MBL3 are connected to sense amplifiers SA1 and SA3, respectively, while the even-numbered main bit lines MBL2 and MBL4 are led into the ground each through transistors Q102 and Q104 whose gates are coupled to control signal VS. In each of the blocks, each of word lines WL1~WLn intersecting the bit lines is coupled to control gates of memory cells that are arranged in a row direction, while each of the sub-bit lines is coupled to adjacent memory cells.

It should be noted that the sub-bit lines are shared by the adjacent blocks, e.g., a half (e.g., the even-numbered) of the sub-bit lines of BLOCKi being shared in the adjacent blocks BLOCKj and a half (e.g., the even-numbered) of the sub-bit lines of BLOCKh being shared by BLOCKg. And a part for connecting each of blocks to the virtual ground lines (i.e., MBL2 and MBL4), SSGgh and SSGij are interposed, at a distance of two of the blocks, between the adjacent blocks for sharing the ground selecting field each other: SSGgh is between BLOCKg and BLOCKh; SSGij between BLOCKi and BLOCKj. Each block, however, has its own selecting part to connect the virtual bit lines to itself in response to block selection lines SBLi1, SBLi2, SBLh1 and SBLh2.

In SSGgh, block selection line SGLg is coupled to gates of selection transistors SGT1gh and SGT3gh which are each connected to the virtual ground lines MBL2 and MBL4, and block selection line SGLh is coupled to gates of selection transistors SGT2gh and SGT4gh which are each connected to MBL2 and MBL4. In SSGij, block selection line SGLi is coupled to gates of selection transistors SGT2ij and SGT4ij which are each connected to the virtual ground lines MBL2 and MBL4, and block selection line SGLj is coupled to gates of selection transistors SGT1ij and SGT3ij which are each connected to MBL2 and MBL4. In respect of the block selection parts exclusive in the blocks, in BLOCKi, block selection signal SBLi1 is coupled to gates of selection transistors SBT1i and SBT3i which are each connected to the virtual bit lines MBL1 and MBL3, and block selection signal SBLi2 is coupled to selection transistors SBT2i and SBT4i which are each connected also to MBL1 and MBL3, and in BLOCKh, block selection signal SBLh1 is coupled to gates of selection transistors SBT1h and SBT3h which are each connected to the virtual bit lines MBL1 and MBL3, and block selection signal SBLh2 is coupled to selection transistors SBT2h and SBT4h which are each connected also to MBL1 and MBL3. It can be understood that those arrangements in the selection circuit areas may be repeated in the other adjacent blocks.

In a read operation when the memory cell M41 is selected therein as an on-cell, SBLi1 and SGLi go to high levels and SBLi2 and SGLj to low levels, the current path for sensing is formed from the virtual bit line MBL3 to the ground, through selection transistor SBT3i, sub-bit line SBL5, the selected memory cell M41, sub-bit line SBL4, selection transistor SGT2ij, the virtual ground line MBL2 and transistor Q102.

Referring to FIG. 4, the block selection transistors are constructed on an N+ diffusion layer 11, each being associated with a depletion transistor with diffused region 15 formed at the position of the channel over which the other bank selection line passes. Contact holes 14 and 16 are provided to connect MBL1 to SBT1i and SBT2i, and MBL3 to SBT3i and SBT4i, respectively, and field oxide regions 13 isolates the active regions of the two pairs of block selection transistors each other. Thus, the pairs of SBT1i and SBT2i, and of SBT3i and SBT4i each share drain active regions which are contacted to MBL1 and MBL3 respectively. The diffused layers of the odd-numbered sub-bit lines (or the sub-bit lines except for other sub-bit lines which is shared by two adjacent blocks) are contacted to N+ diffusion layer 11. Programmed channel regions 17 each of which has a threshold voltage higher than a power supply voltage are interposed between diffused layers under the virtual ground lines (or the even-numbered main bit lines) and diffused layers of sub-bit lines which are arranged at the opposite side of diffusion layers associated with the ground selection transistors, so that the regions 17 isolate a selected sub-bit line from being electrically connected to an adjacent sub-bit line over which a ground selection line (e.g., SGLj), different from that (e.g., SGLi) laid over the selected sub-bit line, passes in an intersectional pattern. The regions 17 can be formed by an implantation process after patterning the main bit lines. Contact holes 18 and 20 are to connect the virtual ground lines to active regions of the ground selection transistors.

Figure 1:
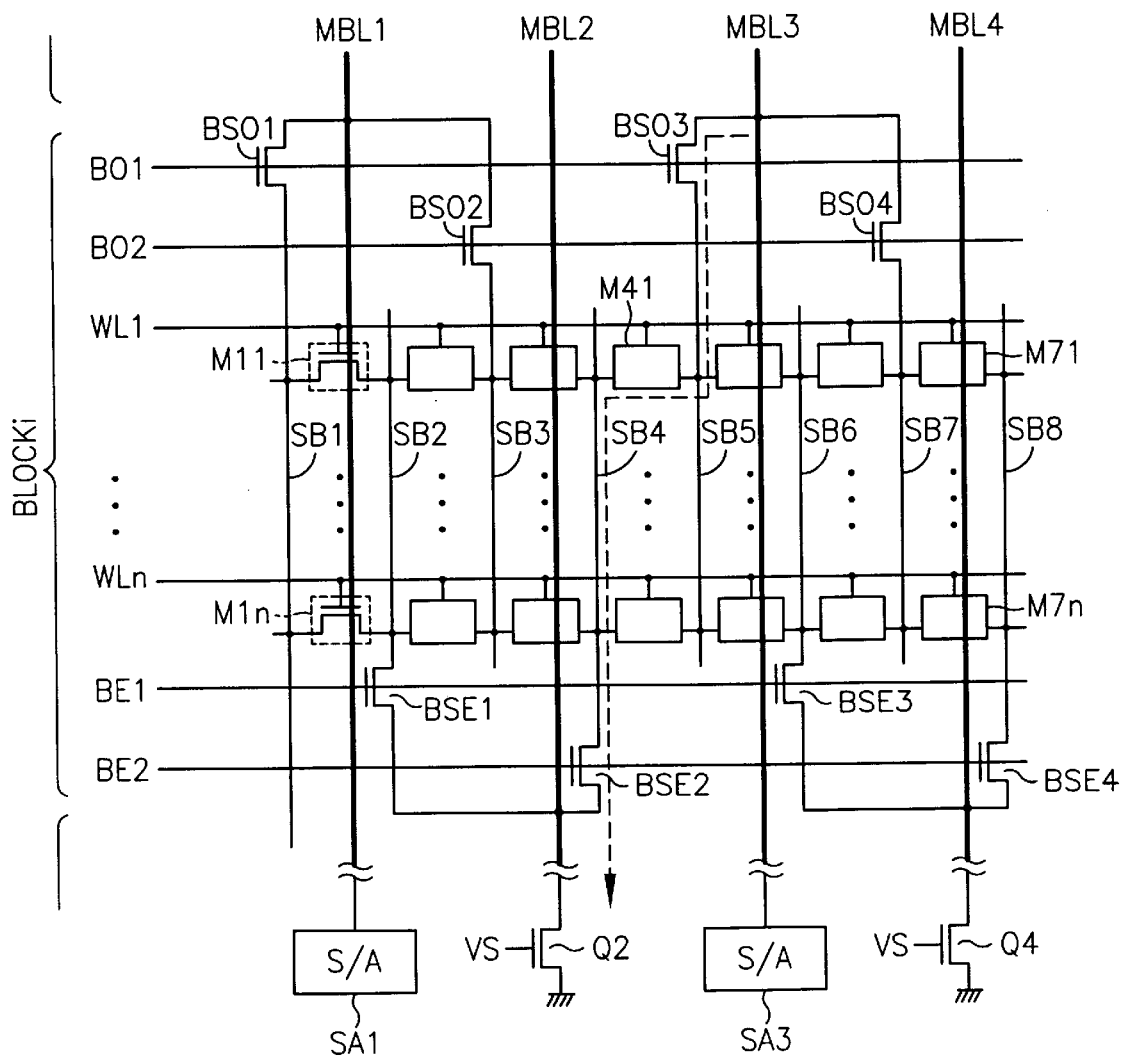
FIG. 1 shows a conventional circuit construction of cell array in a NOR-type ROM.
Figure 2:
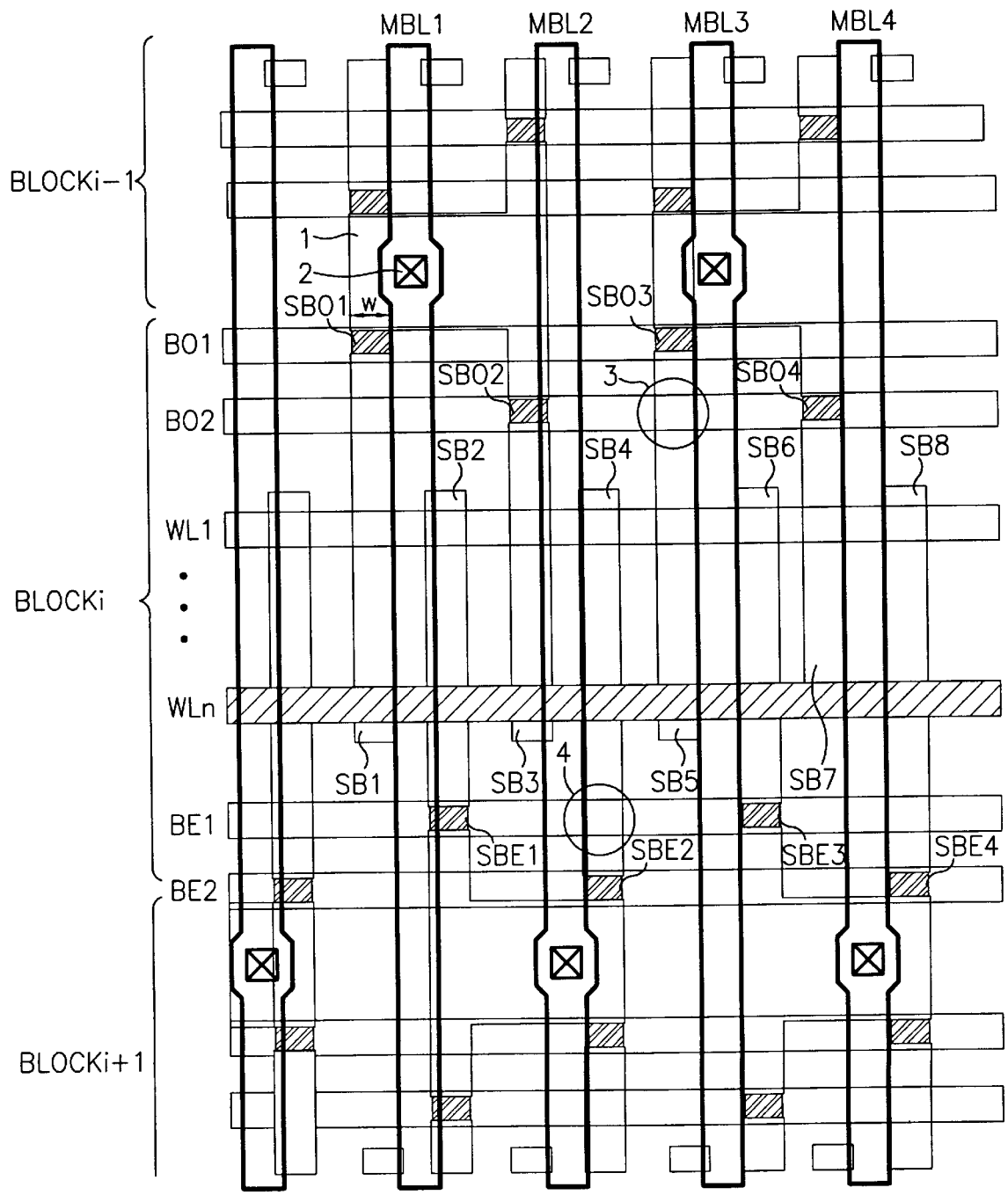
FIG. 2 discloses the specification of layout corresponding to the circuit of FIG. 1.

Each of the block selection transistors, as shown in FIG. 4, has a channel width W wider than that of the bank selection transistor in FIGS. 1 and 2, and is not limited by a width of the diffusion layer of the sub-bit line. Approximately, the channel width W may reach three times of that of the diffusion layer of the sub-bit line. The staggered and shared arrangement with the ground selection transistors and sub-bit lines makes the current path for sensing more simple and less resistive, because, for instance, the aforementioned current path for the memory cell M41 includes three transistor regions, that is, SBT3i, the channel region of the depletion transistor which is serially connected to SBT3i and has a control gate of SBLi2, and SGT2ij (see the four transistor regions for the equivalent sensing path in FIGS. 1 and 2). Further, the common using of half of the diffusion layers of the sub-bit lines between adjacent blocks provides spare areas in the cell array region of the memory device.

Figure 5:
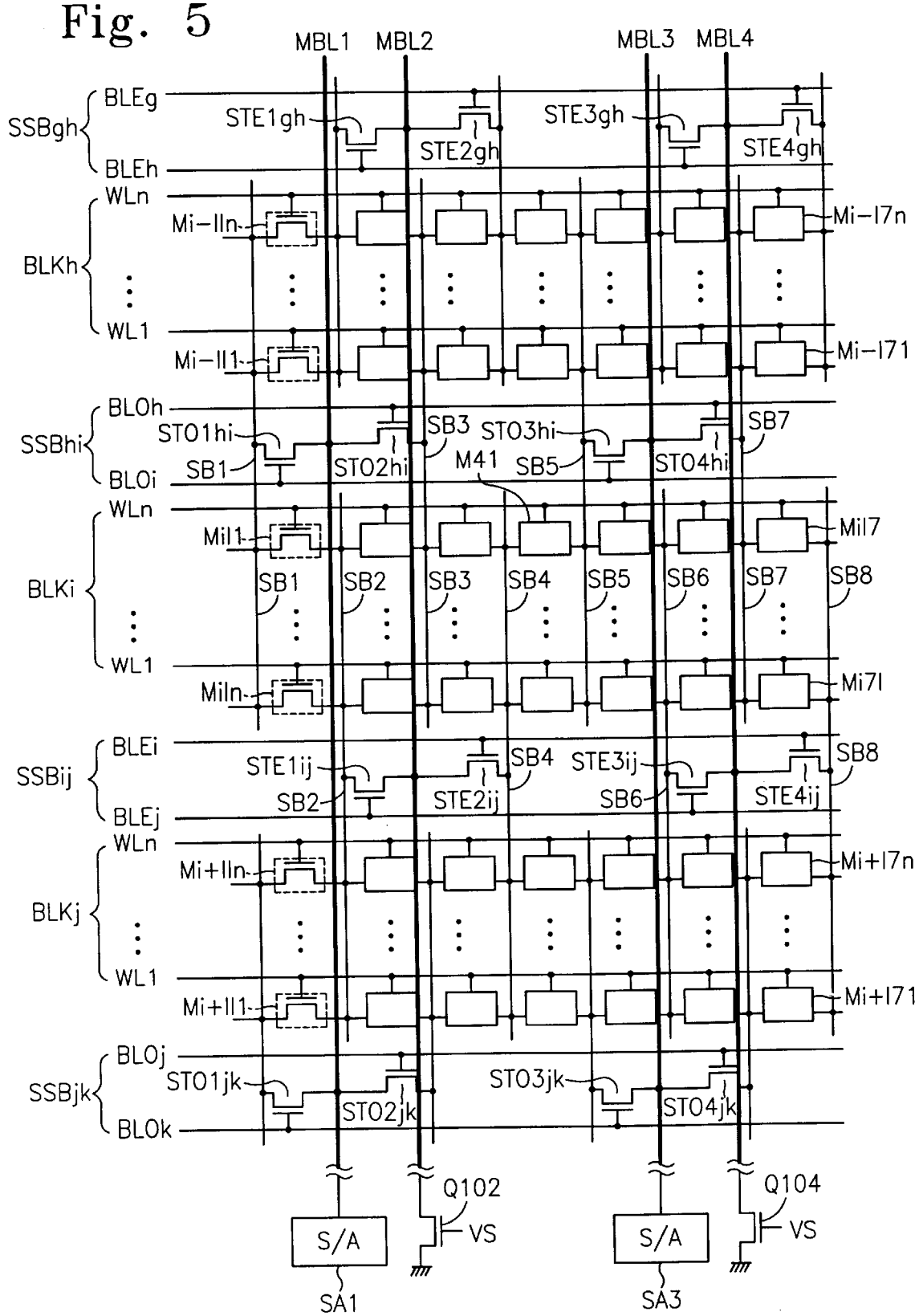
FIG. 5 a circuit diagram of a proposed cell array in a ROM according to another preferred embodiment of the invention.
Figure 6:
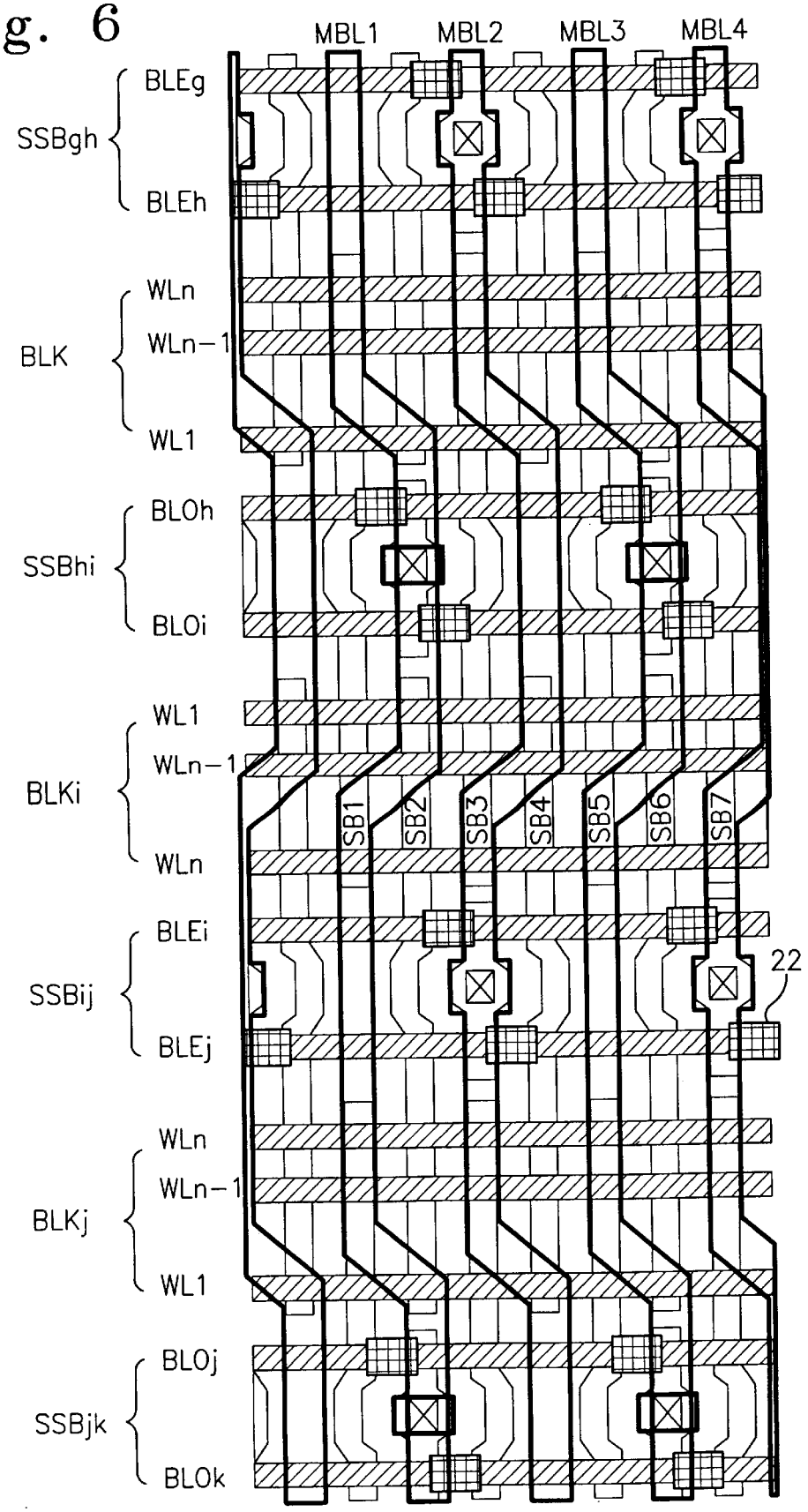
FIG. 6 is a plan view disclosing a specification of a layout corresponding to the circuit of FIG. 5.

Now, FIGS. 5 and 6 show another useful implementation of the invention and the characteristics about that will be described below. Noticeably, the arranged pattern disclosed in FIG. 5 is to share all of selection transistors as well as sub-bit lines.

Referring to FIG. 5, subsequently adjacent blocks BLOCKh, BLOCKi and BLOCKj are arranged therewith. Main bit lines MBL1~MBL4 are arranged in parallel with sub-bit lines SB1~SB8. The two hierarchical bit lines of the main bit lines and sub-bit lines are connected therebetween through selection transistors STE* (to interconnect even-numbered main and sub-bit lines) and STO* (to interconnect odd-numbered main and sub-bit lines), with * denoting its subsidiary references. As is in the former embodiment, the odd- and even-numbered main bit lines, MBL1 and MBL3, and MBL2 and MBL4, are each referred to as virtual bit and ground lines. In each of the blocks, one of the odd-numbered main bit lines MBL1 and MBL3 (or the virtual bit lines) are connected to two adjacent odd-numbered sub-bit lines, SB1 and SB3, through two of the odd-numbered block selection transistors STO*, and one of the even-numbered main bit lines MBL2 and MBL4 (or the virtual ground lines) are connected to two adjacent even-numbered sub-bit lines, SB2 and SB4, through two of the even-numbered ground selection transistors STE*. MBL1 and MBL3 are connected to sense amplifiers SA1 and SA3, respectively, while MBL2 and MBL4 are each led into the ground through transistors Q102 and Q104 whose gates are coupled to control signal VS. In each of the blocks, each of word lines WL1~WLn intersecting the bit lines is coupled to control gates of memory cells that are arranged in a row direction, while each of the sub-bit lines is coupled to adjacent memory cells.

One of proposed differences from the scheme of FIG. 3 is that a half of the sub-bit lines in a block are completely shared by its adjacent block, e.g., one half (e.g., the odd-numbered) of the sub-bit lines of BLKi are shared by BLKh and the other half (e.g., the even-numbered) of the sub-bit lines of BLKi are shared by BLKj. And parts for connecting each of blocks to the virtual bit and ground lines, SSBgh, SSBhi, SSBij and SSBjk, are interposed between each of the adjacent blocks for commonly using the selecting field: SSBgh is between BLKg and BLKh; SSBhi between BLKh and BLKi; SSGij between BLKi and BLKj.

In SSBgh, block selection line BLEg is coupled to gates of selection transistors STE2gh and STE4gh which are each connected to MBL2 and MBL4, and block selection line BLEh is coupled to gates of selection transistors STE1gh and STE3gh which are each connected to MBL2 and MBL4. In SSBhi, block selection line BLOg is coupled to the gates of selection transistors STO2hi and STO4hi which are each connected to MBL1 and MBL3, and block selection line BLOi is coupled to the gates of selection transistors STO1hi and STO3hi which are each connected to MBL1 and MBL3. In SSBij, block selection line BLEi is coupled to the gates of selection transistors STE2ij and STE4ij which are each connected to MBL2 and MBL4, and block selection line BLEj is coupled to the gates of selection transistors STE1ij and STE3ij which are each connected to MBL2 and MBL4. In SSBjk, block selection line BLOj is coupled to the gates of selection transistors STO2jk and STO4jk which are each connected to MBL1 and MBL3, and block selection line BLOk is coupled to the gates of selection transistors STO1jk and STO3jk which are each connected to MBL1 and MBL3. In the circuit arrangement, the selection transistors BLO* is used for connecting a virtual bit line to a sub-bit line while the selection transistors BLE* activates for connecting a virtual ground line to a sub-bit line. When the memory cell M41 of BLKi is selected therein as an on-cell in a read mode, as BLOi and BLEi go to high levels while BLOh and BLEj to low levels, the current path for sensing is formed from the virtual bit line MBL3 to the ground, through selection transistor STO3hi, sub-bit line SB5, the selected memory cell M41, sub-bit line SB4, selection transistor STE2ij, the virtual ground line MBL2 and transistor Q102. At this time, the control signal VS is at a high level to turn Q102 on.

In the layout pattern of FIG. 5, as shown in FIG. 6, contact holes for connecting the main bit lines and active regions of the selecting transistors are interposed between two selection lines of each shared selection part, as is in the shared ground selection parts of the former embodiment. Programmed channel regions 22 each of which has a threshold voltage higher than a power supply voltage are interposed between diffusion layers under the virtual ground lines (or the even-numbered main bit lines) and diffused layers of sub-bit lines which are arranged at the opposite side of diffusion layers associated with the selection transistors, so that the regions 22 isolates a selected sub-bit line from being electrically connected to an adjacent sub-bit line over which a selection line (e.g., BLEj), different from that (e.g., BLEi) laid over the selected sub-bit line, passes in an intersectional pattern. The regions 22 can be formed by an implantation process after patterning the main bit lines.

The staggered and shared arrangement with the ground selection transistors and sub-bit lines makes the current path for sensing more simple and less resistive, because, for instance, the aforementioned current path for the memory cell M41 includes two block selection transistor regions, that is, STO3hi and STE2ij (see the four transistor regions for the equivalent sensing path in FIGS. 1 and 2). Further, the entirely common use of half of half the diffusion layers of the sub-bit lines between adjacent blocks further provides spare areas in the cell array region of the memory device, as well as a decrease of capacitance during read operation.

From the aforementioned embodiments, it is possible to enhance integration capability for high density, speed for reading data from a selected memory cell by reducing capacitance on the sensing path, and to provide efficiency for designing a cell array.

While this invention has been described in connection with what is presently considered to be the practical and preferred embodiments, it is to be understood that the invention is not limited to the disclosed embodiment, but, on the contrary, is intended to cover various modifications and equivalent arrangements included within the scope of the invention.

What is claimed is:

1. A read only memory, comprising:
    a plurality of main bit lines;
    a plurality of sub-bit lines;
    a plurality of memory blocks each associated with the main bit lines and the sub-bit lines, and each containing a plurality of memory cells for storing information;

a plurality of sense amplifiers for reading the information stored in the memory cells through the main bit lines a block selection part disposed between the memory blocks, having a plurality of block selection transistors connecting the main bit lines to the sub-bit lines;

wherein the sub-bit lines elongate to at least an adjacent block and are alternatively connected to the main bit lines through the block selection part.

2. The read only memory of claim 1, wherein each of the block selection parts are commonly used by adjacent blocks.

3. A read only memory having a plurality of main bit lines and sub-bit lines, comprising:

a substrate in which a plurality of blocks are defined, each of the blocks having a plurality of memory cells for storing information;

a plurality of diffusion layers formed in the substrate to be used as the sub-bit lines and arranged in a row direction, wherein the diffusion layers belong to one of the blocks and are elongated to service adjacent blocks;

a plurality of block selection transistors formed in a selection part and shared by adjacent blocks;

a plurality of block selection lines formed of conductive layers arranged in a column direction and formed over the diffusion layers in an intersectional pattern, the selection lines being connected to the block selection transistors; and a plurality of conductive layers formed over the block selection lines to be used for the main bit lines and selectively connected to the sub-bit lines through the block selection transistors.

4. The read only memory of claim 3, wherein one of the plurality of diffusion layers is electrically disconnected from another of the plurality of diffusion layers through a programmed region.

5. A read only memory having a plurality of main bit lines and sub-bit lines comprising:

a substrate in which a plurality of blocks are defined, each of the blocks having a plurality of memory cells for storing information;

a plurality of diffusion layers formed in the substrate to be used for the sub-bit lines and arranged in a row direction, wherein the diffusion layers belong to one of the blocks and are elongated to service an adjacent block;

a plurality of first block selection transistors being formed in a diffused region and defined by field oxide regions;

a plurality of first block selection lines formed of conductive layers arranged in a column direction and formed over the diffusion layers in an intersectional pattern, the first block selection lines being connected to the first block selection transistors;

a plurality of second block selection transistors formed in a second selection part and being shared by an adjacent block;

a plurality of second block selection lines of conductive layers arranged in the column direction and formed over the diffusion layers in an intersectional pattern, the second block selection lines being connected to the second block selection transistors; and a plurality of conductive layers formed over the block selection lines to be used for the main bit lines and selectively connected to the sub-bit lines through the first and second block selection transistors.

6. The read only memory of claim 5, wherein one of the plurality of diffusion layers is electrically disconnected from another of the plurality of diffusion layers through a programmed region.

7. The read only memory of claim 5, wherein the first block selection transistors are associated with a depletion transistor in the diffused region when a read operation is being conductive for reading information from a selected memory cell of one of the blocks.

8. A read only memory, comprising:

a plurality of main bit lines;

a plurality of memory blocks, each further comprising a plurality of memory cells;

a plurality of sub-bit lines, each sub-bit line being connected to a portion of the memory cells in at least one of the plurality of memory blocks;

a plurality of block selection parts for connecting the sub-bit lines to the main bit lines, each block selection part being placed between two adjacent memory blocks, wherein one or more of the sub-bit lines are connected to the memory cells in adjacent memory blocks, wherein each block selection part operates to connect the sub bit lines of two memory blocks adjacent to the block selection part to the main bit lines.

9. The read only memory of claim 8, wherein the memory blocks are arranged in pairs of memory blocks, and one of the plurality of block selection parts is provided for each pair of memory blocks, placed between the memory blocks forming the pair of memory blocks.

10. The read only memory of claim 8, wherein one of the block selection parts is placed between each of the plurality of memory blocks.

* * * * *